(12) United States Patent
Liou et al.

(10) Patent No.: US 8,071,887 B2
(45) Date of Patent: Dec. 6, 2011

(54) PRINTED CIRCUIT BOARD AND METHOD FOR MANUFACTURING SAME

(75) Inventors: Shing-Tza Liou, Taoyuan (TW); Yao-Wen Bai, Shenzhen (TW); Cheng-Hsien Lin, Taoyuan (TW)

(73) Assignees: FuKui Precision Component (Shenzhen) Co., Ltd., Shenzhen, Guangdong Province (CN); Zhen Ding Technology Co., Ltd., Tayuan, Taoyuan (TW)

( * ) Notice: Subject to any disclaimer, the term of this patent is extended or adjusted under 35 U.S.C. 154(b) by 535 days.

(21) Appl. No.: 12/253,869

(22) Filed: Oct. 17, 2008

(65) Prior Publication Data
US 2009/0242246 A1  Oct. 1, 2009

(30) Foreign Application Priority Data
Apr. 1, 2008  (CN) .......................... 2008 1 0300809

(51) Int. Cl.
*H05K 1/03* (2006.01)

(52) U.S. Cl. ........ 174/256; 174/257; 361/502; 429/221; 429/413; 428/173; 428/408; 428/692.1; 438/118; 257/40; 257/761; 313/46; 313/311; 313/495

(58) Field of Classification Search .................. 174/256, 174/257; 361/502; 429/221, 413; 428/173, 428/408, 692.1; 438/118; 257/40, 761; 313/311, 313/46, 495
See application file for complete search history.

(56) References Cited

U.S. PATENT DOCUMENTS

| | | | |
|---|---|---|---|
| 6,251,522 B1 * | 6/2001 | Tanaka et al. | 428/408 |
| 7,931,956 B2 * | 4/2011 | Fujita | 428/220 |
| 2003/0123189 A1 * | 7/2003 | Sato et al. | 360/234.5 |
| 2004/0017647 A1 * | 1/2004 | Okamoto et al. | 361/502 |
| 2005/0156318 A1 * | 7/2005 | Douglas | 257/761 |
| 2006/0274136 A1 * | 12/2006 | Ushirogouchi et al. | 347/102 |
| 2006/0280912 A1 * | 12/2006 | Liang et al. | 428/173 |
| 2008/0169464 A1 * | 7/2008 | Gong et al. | 257/40 |
| 2009/0053859 A1 * | 2/2009 | Xu et al. | 438/118 |
| 2009/0085454 A1 * | 4/2009 | Li et al. | 313/46 |
| 2009/0142636 A1 * | 6/2009 | Handa | 429/26 |
| 2009/0169725 A1 * | 7/2009 | Zhamu et al. | 427/77 |
| 2009/0169996 A1 * | 7/2009 | Zhamu et al. | 429/221 |
| 2009/0176159 A1 * | 7/2009 | Zhamu et al. | 429/222 |
| 2009/0186276 A1 * | 7/2009 | Zhamu et al. | 429/221 |
| 2010/0021993 A1 * | 1/2010 | Wang et al. | 435/286.1 |
| 2010/0068526 A1 * | 3/2010 | Adams et al. | 428/408 |
| 2010/0141939 A1 * | 6/2010 | Zhan | 356/301 |

\* cited by examiner

*Primary Examiner* — Xiaoliang Chen
(74) *Attorney, Agent, or Firm* — Altis Law Group, Inc.

(57) ABSTRACT

A printed circuit board includes a substrate having a surface, a circuit layer having a plurality of electrical traces formed on the surface, and an electrically conductive metal layer formed on the circuit layer. The circuit layer is comprised of a composite of carbon nano-tubes and metallic nano-particles.

14 Claims, 3 Drawing Sheets

PRINTED CIRCUIT BOARD AND METHOD FOR MANUFACTURING SAME

CROSS-REFERENCE TO RELATED APPLICATIONS

This application is related to the following commonly-assigned copending applications: Ser. No. 12/235,994, entitled "METHOD OF FORMING CIRCUITS ON CIRCUIT BOARD". Disclosures of the above-identified application are incorporated herein by reference in its entirety.

BACKGROUND

1. Field of the Invention

The present invention relates to printed circuit boards and, particularly, to a printed circuit board and a method for manufacturing same using an ink jet printing method.

2. Description of related art

Nowadays, printed circuit boards are widely used in electronic products for electrical connection. In order to achieve miniaturization and multifunction of electronic products, printed circuit boards have become smaller and smaller and have high density interconnection.

Generally, circuits of printed circuit boards are manufactured using a photo-lithographic process. The photo-lithographic process includes a series of processes, such as, coating photoresist layer on a copper clad laminate, exposing the photoresist layer to light beam, developing the photoresist layer to obtain a photoresist pattern, etching the copper clad laminate to obtain a circuit pattern corresponding to the photoresist pattern, peeling off the photoresist pattern, and other required steps. Clearly, the photo-lithographic process is complicated, needs a lot of chemical materials and creates a great deal of non-disposable waste. Therefore, the photo-lithographic process complicates the process of manufacturing the printed circuit boards and cause pollution to the environment.

What is needed, therefore, is a printed circuit board and a method for manufacturing the same which can overcome the above-described problems.

SUMMARY

An exemplary embodiment of a printed circuit board includes a substrate having a surface, a circuit layer having a plurality of electrical traces formed on the surface, and an electrically conductive metal layer formed on the circuit layer. The circuit layer is comprised of a composite of carbon nano-tubes and metallic nano-particles.

Advantages and novel features will become more apparent from the following detailed description when taken in conjunction with the accompanying drawings.

BRIEF DESCRIPTION OF THE DRAWINGS

Many aspects of the present embodiment can be better understood with reference to the following drawings. The components in the drawings are not necessarily drawn to scale, the emphasis instead being placed upon clearly illustrating the principles of the present embodiment. Moreover, in the drawings, like reference numerals designate corresponding parts throughout the several views.

DETAILED DESCRIPTION

An embodiment will now be described in detail below and with reference to the drawings.

An exemplary embodiment of a method for manufacturing a printed circuit board includes the following steps. Firstly, a first circuit layer is formed on a surface of a substrate, and the first circuit layer is comprised of a composite of carbon nano-tubes and metallic nano-particles. Secondly, an electrically conductive metal layer is formed on the first circuit layer, thereby obtaining a desired second circuit layer composed of the first circuit layer and the electrically conductive metal layer.

Figure 1:
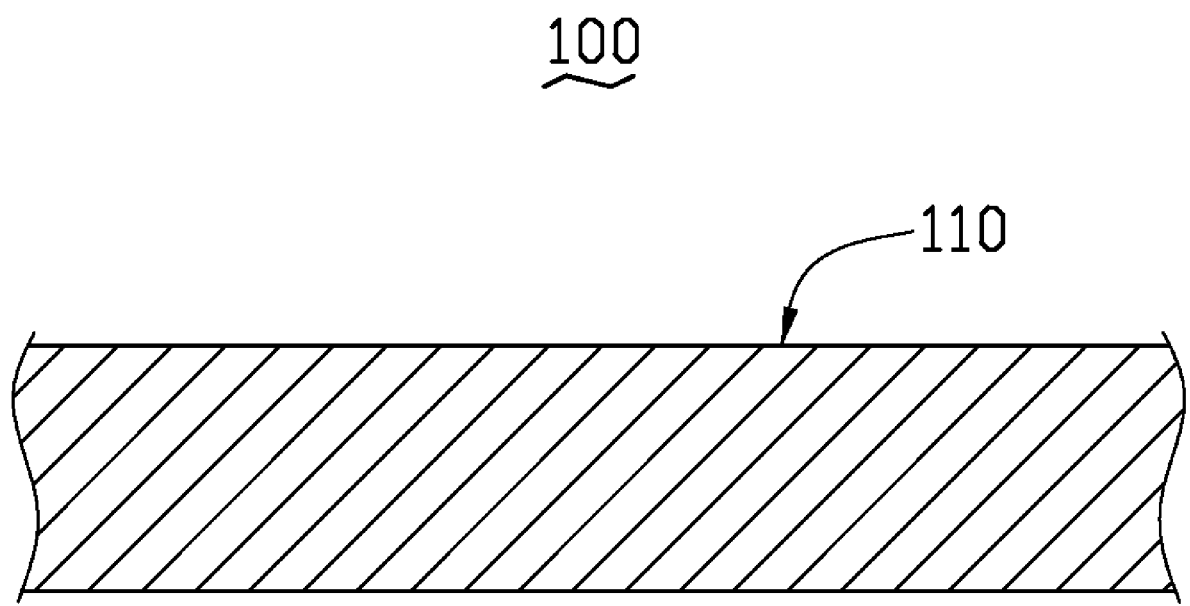
FIG. 1 is a schematic cross-sectional view of a substrate of forming a printed circuit board, according to an exemplary embodiment.

In a general first step, referring to FIG. 1, a substrate 100 is provided. The substrate 100 is a material suitable for making printed circuit boards. For example, the substrate 100 can be an insulating material, such as polyimide (PI), polyethylene terephthalate (PET), polyarylene ether nitrile (PEN), or a semiconductor substrate. In the present embodiment, the substrate 100 is a polyimide layer and has a surface 110 to form a circuit layer thereon.

Figure 2:
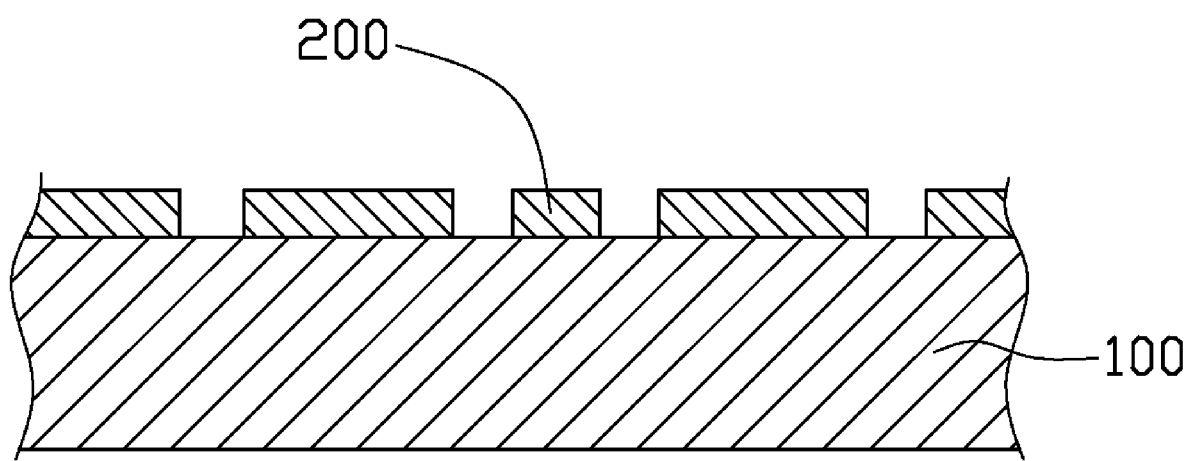
FIG. 2 is a schematic cross-sectional view of a first circuit formed on the substrate of FIG. 1.

In a general second step, a first circuit layer 200 comprised of a composite of carbon nano-tubes and metallic nano-particles is formed on the surface 110 of the substrate 100, as shown in FIG. 2. In order to enable the first circuit layer 200 to properly bind to the surface 110 of the substrate 100, the surface 110 first undergoes a series of surface treating processes, e.g., a cleaning process, a micro-etching process, to remove pollutants, oil, grease, or other contaminants from the surface 110 of the substrate 100. The first circuit layer 200 has a number of electrical traces formed on the surface 110. In order to expediently describe the present embodiment, the electrical traces of the first circuit layer 200 is not shown in the FIG. 2.

The first circuit layer 200 is formed on the surface 110 using an ink jet printing method. In an ink jet printing process, an ink jet printer is capable of jetting a desired ink pattern through setting corresponding parameters such as jetting frequency, a diameter of a nozzle of the ink jet printer, etc. Under the frequency and nozzle diameter circumstance, a volume of the ink droplet jetted from the nozzle is controlled, and therefore a width of the first circuit layer 200 is determined.

For example, in order to obtain the first circuit layer 200 having a width in a range from about 5 micrometers to about 200 micrometers, preferably, from about 5 micrometers to about 20 micrometers, the jetting frequency is set in a range from about 1 hertz (Hz) to about 20 Hz, and the diameter of the nozzle of the ink jet printer is in a range from about 1 micrometer to about 100 micrometers. In a detail process of forming the first circuit layer 200, the nozzle of the ink jet printer is disposed close to the surface 110, and the ink droplets are jetted from the nozzle and dropped on the surface 110 to form an ink pattern layer, i.e., the first circuit layer 200. Under the above-described frequency and nozzle diameter circumstance, the volume of the ink droplet is in a range from about 1 pico-liter (pL) to about 100 pL. Therefore, the first circuit layer 200 formed by these ink droplets achieves the desired width.

The ink used to form the first circuit layer 200 is mainly comprised of carbon nano-tubes and metallic nano-particles in a configuration of one or more carbon nano-tubes encapsulated by a metallic nano-particle layer to form a composite particle. Each composite particle can contain a single-walled nano-tube, a multi-walled nano-tube, an aggregate of two or more single-walled nano-tubes, an aggregate of two or more multi-walled nano-tubes or a combination thereof. The metallic nano-particle layer includes a number of metallic nano-particles. Specifically, the metallic nano-particles are formed on an external sidewall of the at least one of the carbon nano-tubes. The carbon nano-tubes have good mechanical tenacity, and therefore maintain a desirable swell-shrink characteristic of the first circuit layer 200. The metallic nano-particles are electrical conductors, and therefore increase the electrically conductive performance of the first circuit layer 200.

A diameter of each of the aggregates of carbon nano-tubes contained in the composite particle is less than 1 micrometer, and a length of the carbon nano-tube contained in the composite particle is in a range from about 1 nanometer to about 500 nanometers. The metallic nano-particles can be gold, silver, platinum or palladium, and a diameter of the metallic particle is in a range from about 1 nanometer to about 500 nanometers. In the present embodiment, the carbon nano-tubes in the composite particle are single-walled nano-tubes, and the metallic nano-particles are silver nano-particles.

Regarding conventional printed circuit boards, the substrate is made of polyimide or other suitable polymers, the circuit layer formed on the substrate is made of pure metal, e.g., pure copper. Due to the difference of the material of the circuit layer and the substrate, the well-shrink characteristic of the circuit layer is different from that of the substrate. Therefore, in the manufacture of the printed circuit boards, the circuit layer and the substrate 100 swell or shrink with different degrees, and therefore the final manufactured printed circuit boards may occur warping. However, regarding the printed circuit board of the present embodiment, the material for forming the first circuit layer 200 is the composite of the carbon nano-tubes and metallic nano-particles. The composite of the carbon nano-tubes and metallic nano-particles has a well-shrink performance near to that of the substrate 100. Therefore, a well-shrink difference between the first circuit layer 200 and the substrate 100 is greatly reduced, and thereby avoids warping in the final manufactured printed circuit board.

The composite of the carbon nano-tubes and metallic nano-particles can be synthesized using an electro-deposition method, an electroless-plating method, a method for directly absorbing metallic nano-particles on external sidewall of the carbon nano-tubes, or a method for absorbing metallic ions on external sidewall of the carbon nano-tubes and then reducing the metallic ions into metallic nano-particles.

Furthermore, in addition to the composite of the carbon nano-tubes and metallic nano-particles, the ink used to form the first circuit layer 200 includes a solvent for dispersing the composite. The solvent can be water-soluble medium (e.g., water) or organic solvent. In order to enhance strength of the bond between the first circuit layer 200 and the surface 110, at least one of surface-active agent, dispersant, a binder material, a moisturizing agent, antiseptic and bactericide is added in the ink to adjust viscosity, surface tension, and stability of the ink. The organic solvent can be acetone or ethanol. The water-soluble medium can be distilled water, a water-soluble organic compound, or a mixture of the distilled water and the water-soluble organic compound. The surface-active agent can be an anionic surface-active agent, a cationic surface-active or an amphoteric surface-active agent. The dispersant can be a polyvinyl pyrrolidoneor. The binder material can be a polyvinyl alcohol. The moisturizing agent can be a glycol or a glycerol.

In the present embodiment, at room temperature (e.g., the room temperature is about 25 degree Celsius), the ink of forming the first circuit layer 200 has the following parameters. A viscosity of the ink is in a range from about 1 mPa·s to 40 mPa·s. A surface tension of the ink is in a range from about 20 mN/m to about 60 mN/m. A diameter of each of the particles of the composite of the carbon nano-tube and metallic nano-particles is less than 2 micrometers. A pH value of the ink is from 7 to 8. A conservative period of the ink is at least three months.

Figure 3:
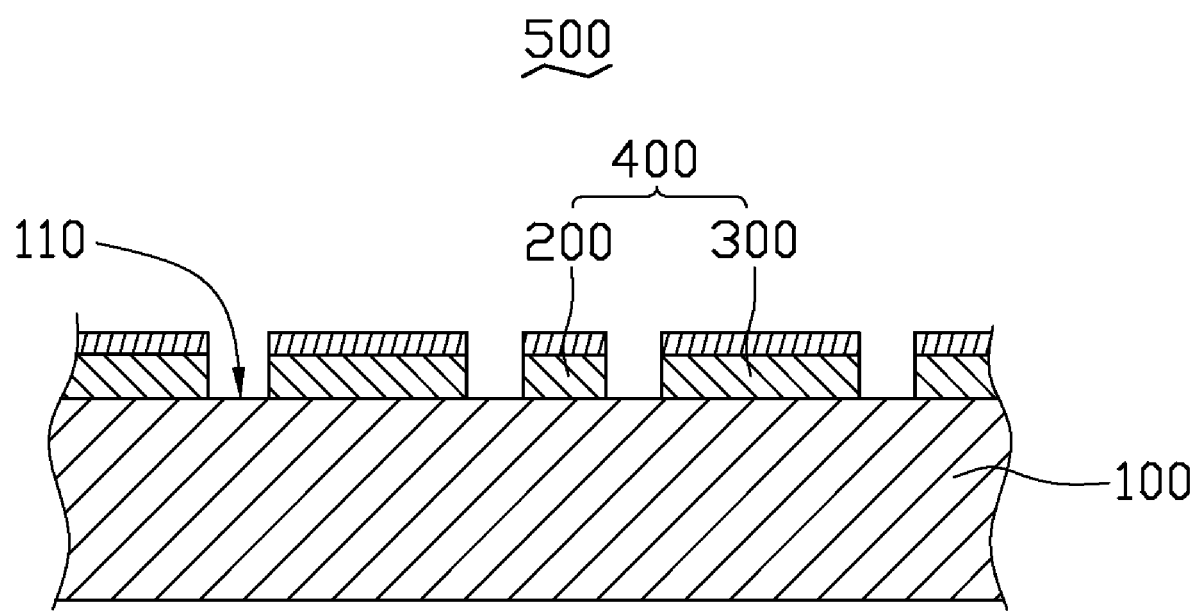
FIG. 3 is a schematic cross-sectional view of an electrically conductive metal layer formed on the first circuit of FIG. 2.

In a general third step, an electrically conductive metal layer 300 is formed on the first circuit layer 200 to get a second circuit layer 400, thereby obtaining a printed circuit board 500, as shown in FIG. 3. Therefore, the first circuit layer 200 and the electrically conductive metal layer 300 formed thereon structure a second circuit layer 400. The electrically conductive metal layer 300 can be formed on the first circuit layer 200 using an electro-plating method or an electroless-plating method. The first circuit layer 200 is comprised of the composite of the carbon nano-tubes and metallic nano-particles. Specifically, the first circuit layer 200 is comprised of a number of composite particles of the composite of the carbon nano-tubes and metallic nano-particles. According to the structure of the composite particles mentioned above, each of the composite particles has electrically conductive performance due to having the metallic nano-particle layer. In addition, clearances inevitably exist between adjacent composite particles of the composite. The electrically conductive meal layer 300 is formed on the first circuit layer 200 and electrically connects adjacent composite particles in the first circuit layer 200. Thus, the first circuit layer 200 is changed into a continuous circuit and has an electrical conductivity. Accordingly, the second circuit layer 400 composed of the first circuit layer 200 and the electrically conductive metal layer 300 has electrical conductivity.

For example, the electrically conductive metal layer 300 is formed on the first circuit layer 200 using the electro-plating method. In an electro-plating process, in one aspect, each of the spaced composite particles is a reaction center, and the electrically conductive metal layer 300 overcoats the spaced composite particles. In another aspect, clearances between adjacent composite particles are filled with the electrically conductive metal layer 300. Therefore, the discontinuous composite particles in the first circuit layer 200 are electrically connected to each other by the electrically conductive metal layer 300, through the electro-plating process. In the present embodiment, the electrically conductive metal layer 300 is made of copper, and the first circuit layer 200 is made of discontinuous or spaced silver nano-particles, so the electrically conductive metal layer 300 electrically connects the discontinuous or spaced silver nano-particles in the second circuit layer 400.

The obtained printed circuit board 500 includes the substrate 100, the first circuit layer 200 formed on the surface 110 of the substrate 100, and the electrically conductive metal layer 300 formed on the first circuit layer 200. The first circuit layer 200 includes a number of carbon nano-tubes and a number of metallic nano-particles. The metallic nano-particles are formed on the external sidewall of each of the carbon nano-tubes. The electrically conductive metal layer 300 is formed on the first circuit layer 200 to electrically connect adjacent carbon nano-tubes. Therefore, the second circuit layer 400 composed of the first circuit layer 200 and the electrically conductive metal layer 300 has electrically conductive characteristics.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A printed circuit board comprising:
an insulating substrate having a surface;
a first circuit layer having a plurality of electrical traces formed on and contacting the surface, the first circuit layer consisting essentially of a composite of carbon nano-tubes and metallic nano-particles; and
an electrically conductive metal layer formed on the first circuit layer for filling clearances between adjacent composite particles of the composite, thereby electrically connecting adjacent composite particles in the circuit layer.

2. The printed circuit board as claimed in claim 1, wherein the composite of carbon nano-tubes and metallic nano-particles comprises a plurality of composite particles.

3. The printed circuit board as claimed in claim 2, wherein each of the composite particles comprises at least one carbon nano-tube, and a plurality of metallic nano-particles formed on an external sidewall of the at least one carbon nano-tube.

4. The printed circuit board as claimed in claim 3, wherein the at least one carbon nano-tube is one of a single-walled carbon nano-tube and a multi-walled carbon nano-tube.

5. The printed circuit board as claimed in claim 2, wherein each of the composite particles comprises at least one aggregate of carbon nano-tubes, and a plurality of metallic nano-particles formed on an external sidewall of the at least one aggregate of carbon nano-tubes.

6. The printed circuit board as claimed in claim 5, wherein the at least one aggregate of carbon nano-tubes is comprised of two or more single-walled carbon nano-tubes, two or more multi-walled carbon nano-tubes, or a combination thereof.

7. The printed circuit board as claimed in claim 2, wherein the electrically conductive metal layer is filled between spaced composite particles.

8. The printed circuit board as claimed in claim 3, wherein a length of the carbon nano-tube contained in the composite particle is in a range from about 1 nanometer to about 500 nanometers.

9. The printed circuit board as claimed in claim 3, wherein a diameter of each of the metallic nano-particles is in a range from about 1 nanometer to about 500 nanometers.

10. The printed circuit board as claimed in claim 3, wherein the metallic nano-particles are comprised of gold, silver, platinum or palladium.

11. The printed circuit board as claimed in claim 5, wherein a diameter of each of the aggregates of carbon nano-tubes contained in the composite particle is less than 1 micrometer.

12. The printed circuit board as claimed in claim 1, wherein a width of the first circuit layer is in a range from about 5 micrometers to about 200 micrometers.

13. The printed circuit board as claimed in claim 1, wherein a width of the first circuit layer is in a range from about 5 micrometers to about 20 micrometers.

14. A printed circuit board comprising:
an insulating substrate having a surface; and
a circuit layer comprising a base layer formed on and contacting the surface and an electrically conductive metal layer formed on the base layer, the base layer consisting essentially of a plurality of carbon nano-tubes, and a plurality of metallic nano-particles, the metallic nano-particles formed on external sidewalls of the carbon nano-tubes.

* * * * *